United States Patent
Barrieau et al.

(10) Patent No.: US 7,251,742 B2
(45) Date of Patent: Jul. 31, 2007

(54) METHOD AND APPARATUS FOR DETERMINING MIS-WIRED ADDRESSABLE LOOPS

(75) Inventors: Mark P. Barrieau, Baldwinville, MA (US); Richard P. Bonneau, Templeton, MA (US); Gregg A. Lupaczyk, Shirley, MA (US)

(73) Assignee: SimplexGrinnell LP, Westminster, MA (US)

( * ) Notice: Subject to any disclaimer, the term of this patent is extended or adjusted under 35 U.S.C. 154(b) by 483 days.

(21) Appl. No.: 10/866,584

(22) Filed: Jun. 12, 2004

(65) Prior Publication Data

US 2005/0278564 A1    Dec. 15, 2005

(51) Int. Cl.
  *G06F 11/00* (2006.01)
(52) U.S. Cl. ............................ 714/4; 714/25; 340/514
(58) Field of Classification Search ................ 714/43, 714/4, 25; 340/508, 514, 506
  See application file for complete search history.

(56) References Cited

U.S. PATENT DOCUMENTS

| | | | | |
|---|---|---|---|---|
| 4,954,809 A | * | 9/1990 | Right et al. | 340/516 |
| 5,933,077 A | * | 8/1999 | Vogt et al. | 340/506 |
| 6,034,601 A | * | 3/2000 | Barrieau et al. | 340/514 |
| 6,459,370 B1 | * | 10/2002 | Barrieau et al. | 340/514 |
| 6,912,671 B2 | * | 6/2005 | Christensen et al. | 714/25 |

* cited by examiner

*Primary Examiner*—Marc Duncan

(57) ABSTRACT

Mis-wired addressable loops are determined by enabling all loops and identifying all devices communicating on all loops. A list of all identified devices is recorded. One at a time, each loop is disconnected, a list of devices that are disabled is determined and recorded for the disconnected loop, and the loop is reconnected. When all of the loops have been processed, the lists of disabled devices are compared and those devices that are wired improperly are determined.

10 Claims, 3 Drawing Sheets

METHOD AND APPARATUS FOR DETERMINING MIS-WIRED ADDRESSABLE LOOPS

BACKGROUND OF THE INVENTION

A fire alarm system can be installed such that it has multiple circuits that are terminated adjacent to each other. Of interest is the case where these circuits are addressable loops that are used to communicate to multiple circuits of addressable fire alarm devices. In some cases, these wires are part of a cable in which the conductors are bundled together and which aids in properly identifying the pairs of wires.

In other cases, for example using THHN wire, the wires are discrete conductors. In these situations, the wires are commonly colored to identify polarity. It is possible to mix up the wires such that a black and white wire pair will terminate as a circuit when in fact they are wired to different loops of devices. This mis-wire may not be detected, since each circuit is complete across multiple loops. However, if a wiring fault, such as a short circuit, should develop on one loop, two loops will be affected.

SUMMARY OF THE INVENTION

This invention provides a method and means for automatically verifying that all addressable compononents on multiple loops are wired only to the proper set of wires, connected to the proper set of terminals. In many case, it is desirable to provide fault tolerance to wiring shorts or opens. This fault tolerance is commonly provided by several means. Redundant wiring paths are used to protect against open circuits. Fault isolator modules or circuits are used to limit a short circuit fualt to a wire segment, protecting all devices on all other wire segments.

A goal of the present invention is to ensure that wires from two distinct loops are not connected to a device. It is desirable to ensure that the system only isolates devices on faulted wire segments.

In accordance with an embodiment of the invention, a method for determining mis-wired addressable loops includes enabling all loops and identifying all devices communicating on all loops. A list of all identified devices is recorded. One at a time, each loop is disconnected, a list of devices that are disabled is determined and recorded for the disconnected loop, and the loop is reconnected. When all of the loops have been processed, the lists of disabled devices are compared and those devices that are wired improperly are determined (i.e., if a device shows up on more than one list).

This method can be executed manually. Alternatively, it can be executed automatically, wherein service personnel can be notified of a detected wiring fault, including an indication of the location of the wiring fault.

The present invention is particularly useful where the loops are part of a fire alarm system.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
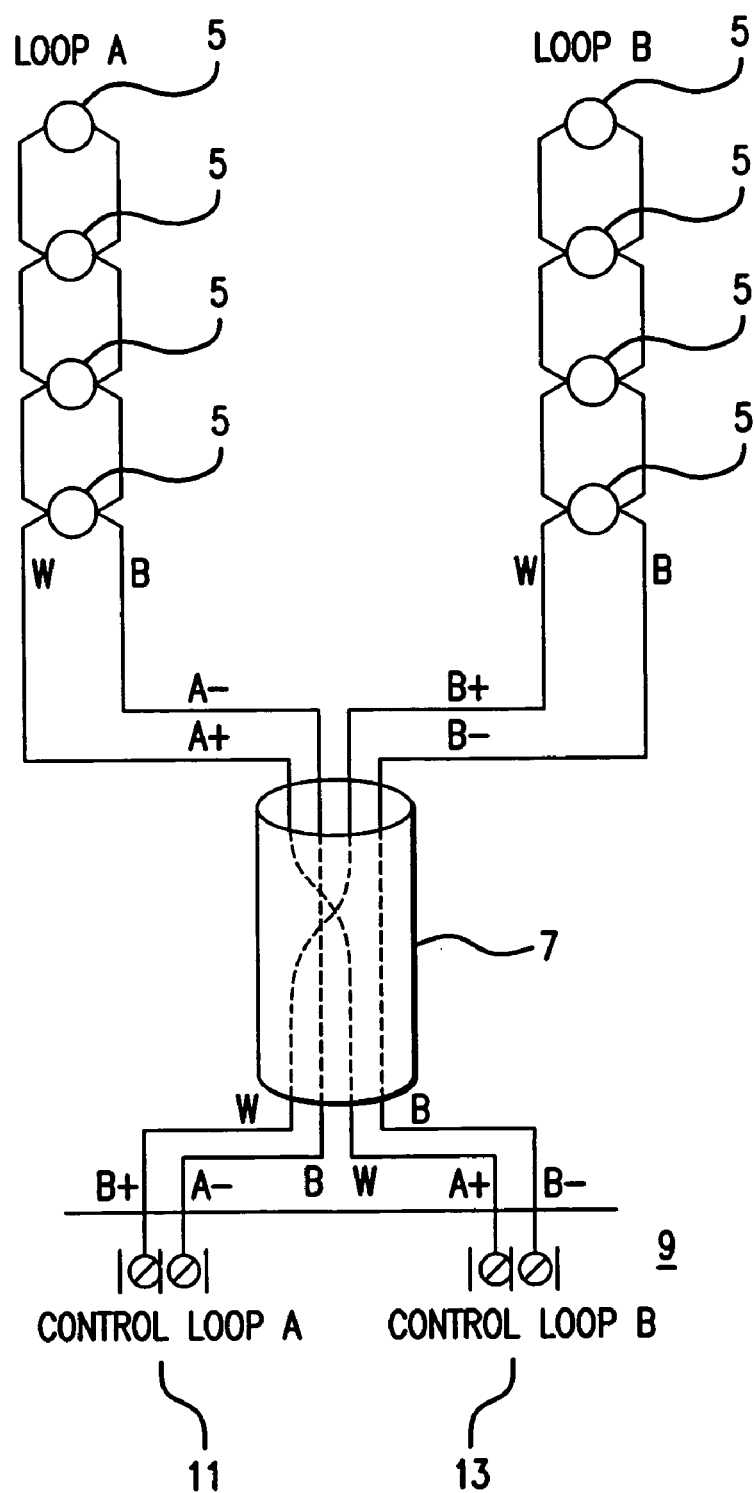
FIG. 1 is a schematic diagram illustrating how it is possible to wire devices across a pair of wires while unintentionally terminating the pair of wires on different loops.

FIG. 1 is a schematic diagram illustrating how it is possible to wire devices across a pair of wires while unintentionally terminating the pair of wires on different loops. Here, addressable devices 5 are connected to existing wires on two separate loops, Loop A and Loop B. Each loop pair typically consists of one white (W) conductor and one black (B) conductor. In a typical retrofit, these wires will be discrete, unbundled conductors, such as THHN wire.

The wires typically enter a conduit 7 in a jumble and become easily crossed, as illustrated by the dashed lines within the conduit 7. In this case, the wires cross in the conduit before they enter the cabinet. At the control panel 9, a white wire (B+) from Loop B and a black wire (A−) from Loop A are connected to Control Loop A terminals 11. Similarly, a white wire (A+) from Loop A and a black wire (B−) from Loop B are connected to Control Loop B terminals 13. Despite the mis-wiring, Loops A and B will operate properly as long as there is no wiring fault.

Figure 2:
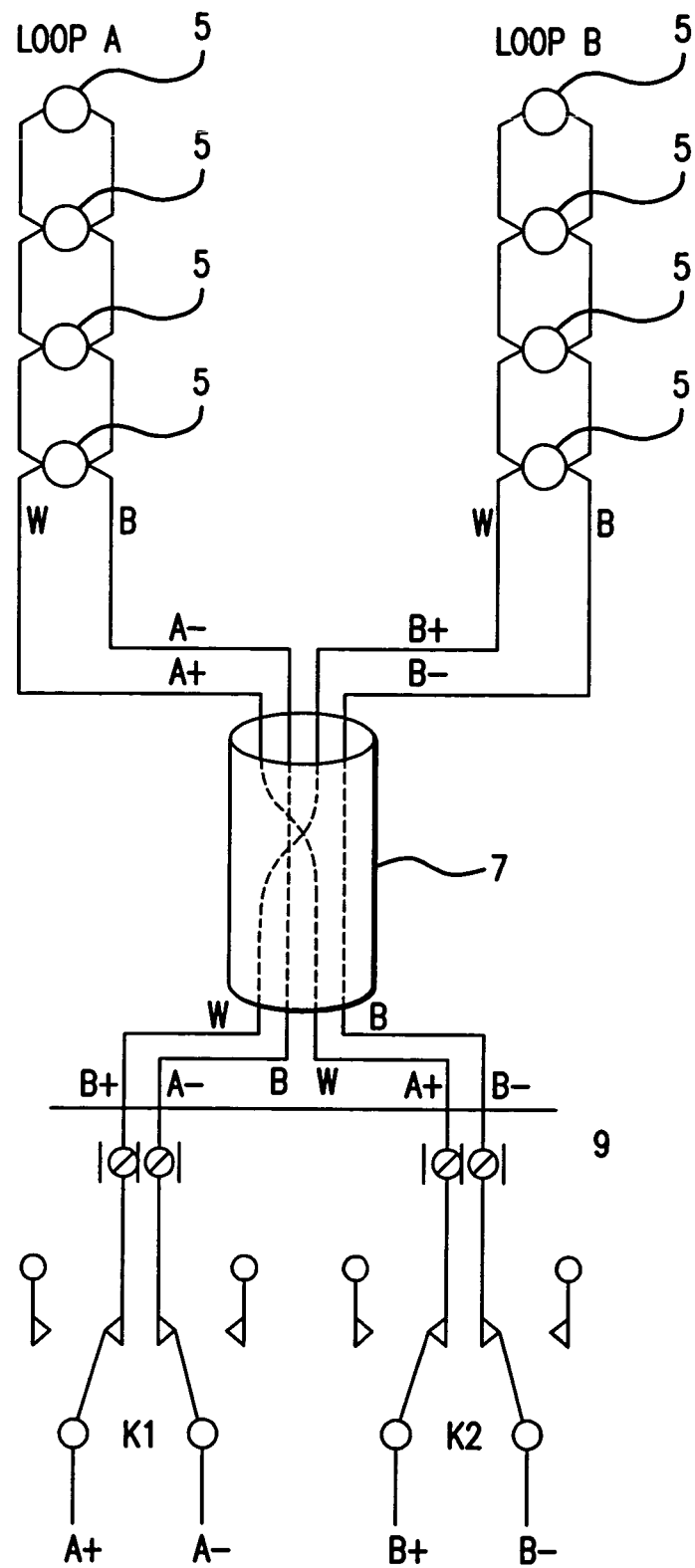
FIG. 2 is a schematic diagram illustrating the loops of FIG. 1 wired through fault isolation relays.

If a short circuit develops on either loop, the control panel will attempt to isolate the fault. FIG. 2 is a schematic diagram illustrating the loops of FIG. 1 wired through fault isolation relays K1 and K2. When the short circuit is detected, the controller disconnects the loop with the fault to isolate the short. The unintended result is that, because of the mis-wiring, the controller disables both loops, since each control circuit relies on one conductor from each loop to form a complete circuit. The devices on the loop with the wiring fault are disabled, as are the devices on the loop without the wiring fault.

For example, if a fault is detected on Loop B, relay K1 will open (because wire B+ is crossed to K1's A+ connection) in an attempt to isolate the loop. However, when K1 opens, it disconnects both wires B+ and A−, thus isolating both Loops A and B.

Figure 3:
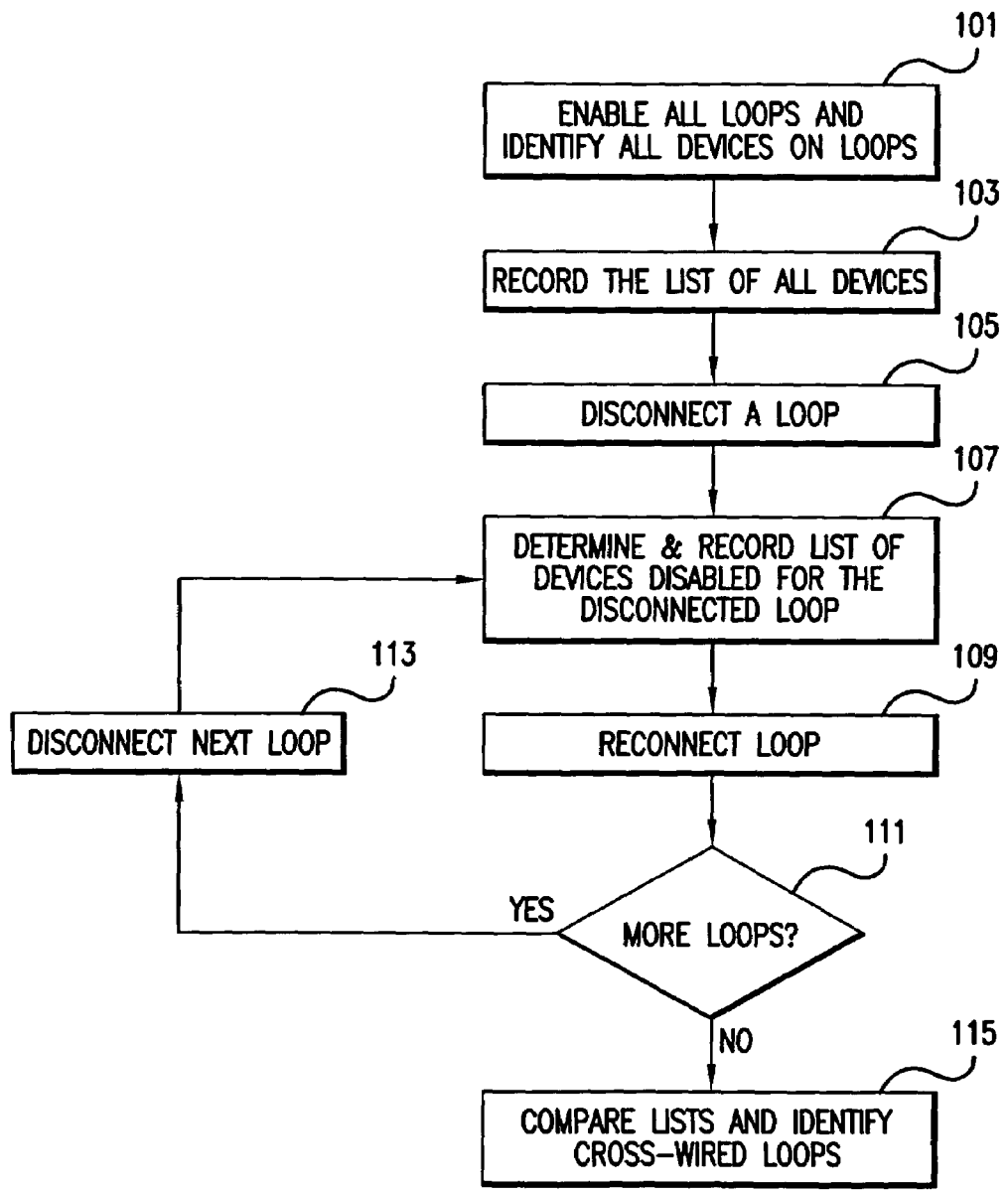
FIG. 3 is a flowchart showing the steps that a system, according to an embodiment of the present invention, performs to verify that each device is wired to the + and − conductors from only a single loop.

FIG. 3 is a flowchart showing the steps that a system, according to an embodiment of the present invention, performs to verify that each device is wired to the + and − conductors from only a single loop.

First, in step 101, all loops are enabled, and all devices on all loops that are communicating are identified. This is done using each device's unique identifier (address). The list of all devices is then recorded (step 103).

Using some isolation means such as the fault isolation relays shown FIG. 2, one of the loops is disconnected (step 105). As each loop is disconnected, some population of devices will be disabled. In step 107, the list of devices that are disabled is determined for the disconnected loop and recorded. At step 109, the disconnected loop is reconnected.

If there are additional loops, as determined at step 111, the next loop is disconnected (step 113), and steps 107 and 109 are repeated.

When all of the loops have been tested, the lists are compared, at step 115. A properly wired device will be disabled only when one specific loop is disconnected. Any device that appears on the "disabled" list of two separate loop disconnects is wired improperly.

The information recorded during the loop disconnect sequence can identify specifically which loops are cross-wired. For example, if device #158 is disabled when either Loop "x" or Loop "y" are disconnected, device #158 is cross-wired between those specific loops.

This diagnostic, i.e., the steps of FIG. 3, can be executed manually, from front panel controls that allow dissconnection of individual loops. In that case, a system trouble log can be used to record the list of devices that are disabled by each loop disconnection.

The diagnostic can also be run automatically, with the controller keeping track of which devices are assigned to each loop, and which devices are wired to multiple loops. In this case, the controller can notify service personnel of the wiring fault. The action message can include information valuable in locating the wiring fault.

Those of ordinary skill in the art should recognize that methods involved in determining mis-wired addressable loops may be embodied in a computer program that includes a computer usable medium. For example, such a computer usable medium can include a readable memory device, such as a solid state memory device, a hard drive device, a CD-ROM, a DVD-ROM, or a computer diskette, having stored computer-readable program code segments. The computer readable medium can also include a communications or transmission medium, such as a bus or a communications link, either optical, wired, or wireless, carrying program code segments as digital or analog data signals.

While the system has been particularly shown and described with references to particular embodiments, it will be understood by those of ordinary skill in the art that various changes in form and details may be made without departing from the scope of the invention. For example, the methods of the invention can be applied to various environments, and are not limited to the described environment.

What is claimed is:

1. A method for determining mis-wired addressable loops, comprising the steps of:
    enabling all loops;
    identifying all devices that are communicating on all loops;
    recording a list of all identified devices;
    for each loop
        disconnecting the loop,
        determining and recording a list of devices that are disabled for the disconnected loop, and
        reconnecting the disconnected loop; and
    comparing the lists of disabled devices and determining any devices that are wired improperly.

2. The method of claim 1, wherein the steps of claim 1 are executed manually.

3. The method of claim 1, wherein the steps of claim 1 are executed automatically.

4. The method of claim 3, further comprising the step of: notifying service personnel of a detected wiring fault.

5. The method of claim 4, wherein the step of notifying includes providing a location indication of the wiring fault.

6. The method of claim 1, wherein the loops are part of a fire alarm system.

7. A computer readable medium comprising a readable memory device containing program instructions for determining mis-wired addressable loops, the computer readable medium comprising:
    computer readable code for enabling all loops;
    computer readable code for identifying all devices tat are communicating on all loops;
    computer readable code for recording a list of all identified devices;
    computer readable code for performing, for each loop, the steps of disconnecting the loop,
        determining and recording a list of devices that are disabled forte disconnected loop, and
        reconnecting the disconnected loop; and
    computer readable code for comparing the lists of disabled devices and determining any devices that are wired improperly.

8. The computer readable medium of claim 7, further comprising: computer readable code for notifying service personnel of a detected wiring fault.

9. The computer readable medium of claim 7, futher comprising: computer readable code for providing a location indication of a detected wiring fault.

10. The computer readable medium of claim 7, wherein the loops are part of a fire alarm system.

* * * * *